United States Patent [19]

Hill

[11] 4,350,962

[45] Sep. 21, 1982

[54] R.F. SWITCHED AMPLIFIER AND A.M. MODULATOR

[75] Inventor: Ian L. Hill, Turramurra, Australia

[73] Assignee: T.B.C. Pty. Limited, Thornleigh, Australia

[21] Appl. No.: 183,875

[22] Filed: Sep. 4, 1980

[30] Foreign Application Priority Data

Sep. 25, 1979 [AU] Australia .............................. PE0649

[51] Int. Cl.³ .................... H03C 1/16; H03F 3/24; H03F 5/00
[52] U.S. Cl. ...................................... 332/60; 328/27; 328/102; 328/247; 330/137; 330/187; 455/108; 455/127
[58] Field of Search ............ 332/9 R, 9 T, 31 R, 332/31 T, 60-62, 63; 455/108, 109, 127; 375/24, 41, 43, 59, 61; 330/129, 130, 137, 186-188; 328/27, 34, 91, 102, 247

[56] References Cited

U.S. PATENT DOCUMENTS

| | | | |
|---|---|---|---|
| 2,603,746 | 7/1952 | Burkhart et al. | 328/91 |
| 2,972,110 | 2/1961 | Watters | 332/9 R X |
| 3,105,196 | 9/1963 | Lerner | 328/91 |
| 4,058,769 | 11/1977 | Alderman | 455/108 |

*Primary Examiner*—Siegfried H. Grimm
*Attorney, Agent, or Firm*—Ladas & Parry

[57] ABSTRACT

An amplifier circuit incorporating a valve or vacuum tube in the grounded grid configuration is disclosed. The anode D.C. potential is greater than the cathode D.C. potential which is in turn greater than the grid D.C. potential. The cathode is switched at an R.F. rate to a further D.C. potential below that of the grid. Preferably the grid potential substantially cuts off cathode current flow with the switch open. The amplifier finds particular application as an output amplifier in an A.M. R.F. transmitter with the modulation being provided by high level anode modulation. The tube or valve can be a triode, tetrode, or pentode.

10 Claims, 5 Drawing Figures

R.F. SWITCHED AMPLIFIER AND A.M. MODULATOR

The present invention relates to an amplifier circuit incorporating a valve. The circuit finds particular application in, but is not limited to, the output stage of an R.F. transmitter.

The output stage of a valve (or tube) radio frequency transmitter consists of a triode or tetrode/pentode valve amplifier generally operating in Class B, C or D mode.

The tetrode/pentode valve amplifier generally has a higher radio frequency gain than the triode and requires little neutralisation, but has the disadvantage that a screen grid power supply is required. In addition, the tetrode/pentode valve has a greater tendency to generate unwanted parasitic oscillations. In the case of an anode (or plate) modulated amplifying stage both anode and screen grid must be modulated.

The triode tube has advantages in that it requires no screen power supply and hence a triode amplifying stage is generally more economical to construct and to operate (although this is offset by higher drive requirements). When grid driven, the triode amplifying stage must be neutralised using one of a number of neutralising arrangements and neutralising adjustments are generally necessary when the valve is changed because of differences in individual valve characteristics.

It is the object of the present inventionn to overcome or substantially ameliorate the disadvantages of the prior art amplifier circuits.

According to one aspect of the present invention there is disclosed an amplifier circuit comprising a valve having an anode, a cathode and a grid; the cathode being supplied with a first D.C. potential, the grid being supplied with a second D.C. potential and the anode being supplied with a third D.C. potential; said third potential being greater than said first potential, said first potential being greater than said second potential and said grid being A.C. coupled to ground; wherein said cathode is connected via switch means to a further potential less than said second potential, said switch means being operable at a rate determined by the desired frequency of the output of said anode. Preferably the further potential is ground and the valve is a triode although the invention is applicable to tetrode/pentode valves in the grounded grid configuration.

One embodiment of the present invention will now be described with reference to the drawings in which.

Figure 1:
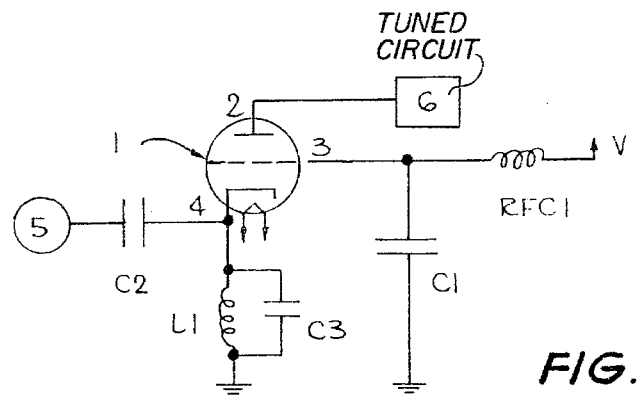
FIG. 1 is a circuit diagram of a prior art grounded grid triode amplifier stage.

It is known in the prior art circuit of FIG. 1 to overcome the disadvantage of neutralising adjustments by operating a triode in a grounded grid configuration.

As seen in FIG. 1, the grid 3 is at R.F. ground potential and the drive is fed into the cathode circuit. The R.F. energy provided by the previous stage or driving source 5 is fed through capacitor C2 to the valve 1. Feedback between anode 2 and cathode 4 is substantially eliminated by the screening effect of the grounded grid 3. The anode 2 is connected to an output tuned circuit 6. The disadvantage of the grounded grid triode amplifier is that, as a Class B or Class C amplifier, the input circuit including coil L1 and capacitor C3 must be tuned to resonance and, in the case of a modulated output amplifier, pre-modulation of the driving R.F. energy from source 5 is necessary. The R.F. drive power required from source 5 is also considerably higher than that of a tetrode or pentode valve.

The preferred embodiment of the present invention uses the advantages of a grounded grid R.F. amplifier and eliminates the need for tuned circuits and pre-modulation. It also requires very little R.F. drive from the previous stage or source 5. In addition, because the amplifier of the preferred embodiment illustrated in FIG. 2, has a wide band (untuned) input and operates in a switched mode there is substantially no tendency to generate parasitic oscillations.

Figure 2:
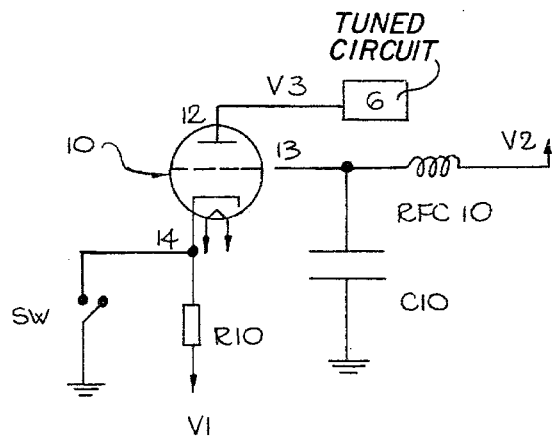
FIG. 2 is a schematic circuit diagram of the preferred embodiment of the present invention.

As seen in FIG. 2, the grid of the valve 10 is grounded to radio frequency through capacitor C10. The cathode 14 and the grid 13 of the valve 10 are provided with positive potentials V1 and V2 respectively such that V1 is higher than V2 preferably by an amount at least necessary to cut off all anode current flow. The value of cathode resistor R10 can therefore be very high. On closing switch SW the cathode potential falls to zero and the positive grid potential now causes a large pulse of grid current and anode current. On opening the switch SW the grid current and anode current ceases because the cathode potential is restored to V1. If the switch SW operates at the radio frequency rate, square wave pulses of current can flow through the valve 10 depending upon the anode tuning arrangement or output tuned circuit 6.

Figure 3:
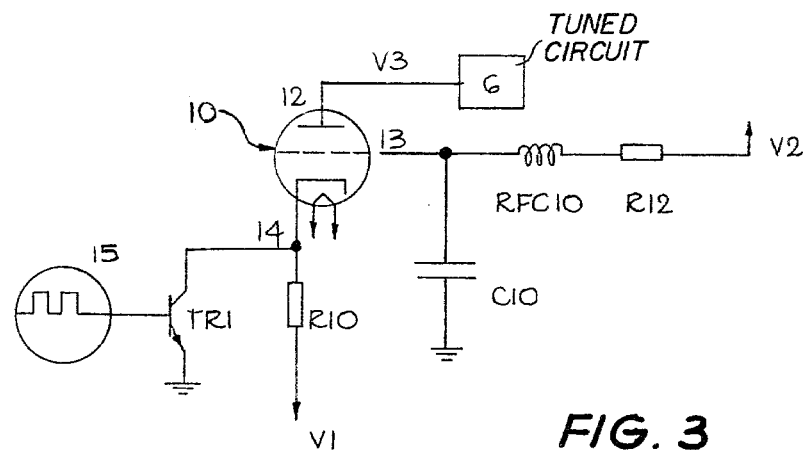
FIG. 3 is an alternative circuit to that of FIG. 2.

As seen in FIG. 3, a switching transistor TR1 preferably comprises the switch SW of FIG. 2 and square wave pulses of R.F. drive are fed from source 15 to the base of the switching transistor TR1 so that the transistor TR1 is saturated during positive pulses. The cathode current flows through transistor TR1 but the potential of the cathode 14 does now rise substantially above the collector saturation potential of the switching transistor TR1. Modulation can be applied to the R.F. amplifier in the normal manner by varying the anode potential V3 (this is known as high level anode or plate modulation).

Figure 4:
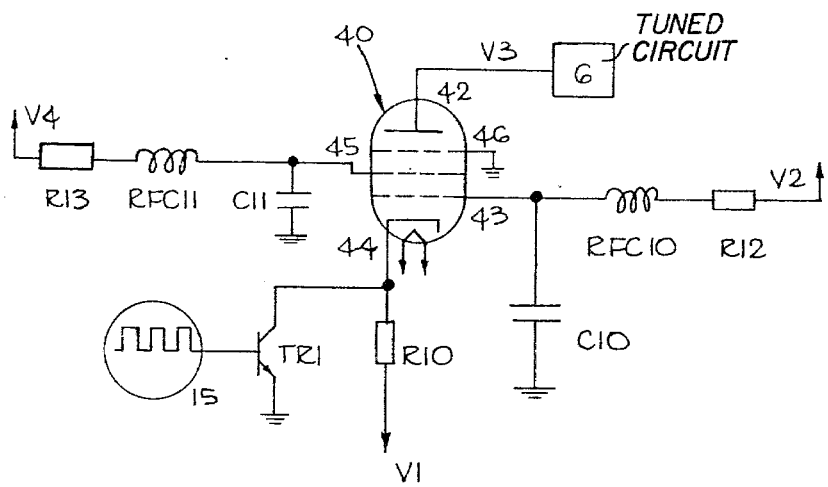
FIG. 4 is a third embodiment using a tetrode or pentode valve in a circuit similar to that of FIG. 3.

FIG. 4 shows a tetrode or pentode valve 40 in the grounded grid configuration in which the anode 42, grid 43, and cathode 44 are connected as in FIG. 3. The screen 45 is A.C. grounded and connected in similar fashion to the grid 43. However, the screen 45 is connected to a fourth positive potential V4 which is intermediate the anode potential V3 and the grid potential V2. Typically the potential V4 is approximately 250 V. When the valve 40 is a pentode a suppressor grid 46 is provided and is grounded (as illustrated), however, naturally when the valve 40 is a tetrode the suppressor grid 46 is absent.

Figure 5:
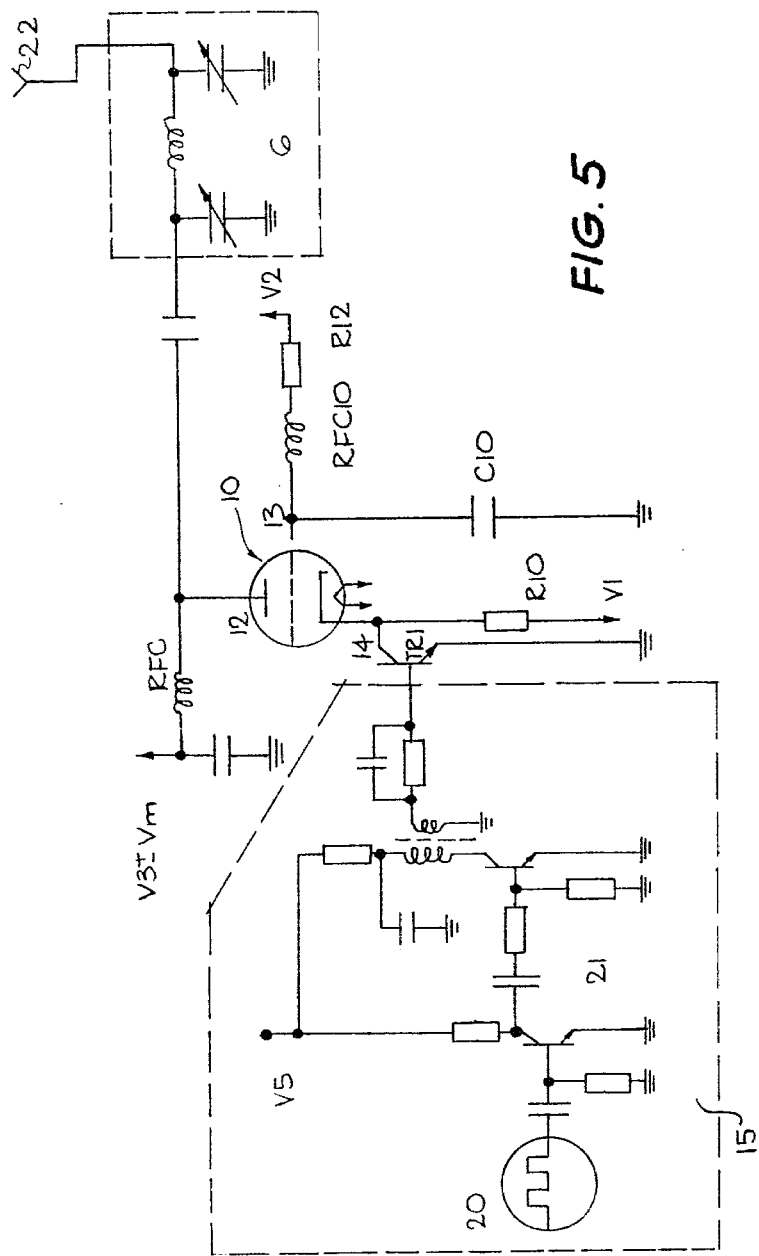
FIG. 5 is a circuit diagram of an actual circuit similar to that of FIG. 3 and embodying the present invention.

FIG. 5 shows the circuit diagram of the output stages of a practical transmitter embodying the present invention.

As seen in FIG. 5, the source 15 of FIGS. 3 and 4 takes the form of a one Volt peak-to-peak oscillator or pulse generator 20, the output of which is fed into a two stage common emitter configuration transistor amplifier 21. The output of amplifier 21 is transformer coupled to the base of the transistor TR1 which is switched between ON (conducting and saturated) and OFF (non-conducting) at a radio frequency rate, typically in the A.M. broadcast band in the vicinity of 1 MHz. The anode voltage V3 is modulated in any conventional fashion with a modulation voltage Vm. Typically the anode voltage is 2.5 kV and the valve 10 is a conventional triode valve such as type 3CX1500A or 8873 manufactured by Varian Inc. of the U.S.A. The tuned output stage 6 is conventional and typically comprises a pi-tuned section. The output stage 6 can be directly connected to the aerial 22. Typically the grid supply voltage V2 is 48 V and the cathode supply voltage is 72 V. The supply voltage V5 for the amplifier 21 is typically 24 V.

The foregoing describes only some embodiments of the present invention and modifications, obvious to those skilled in the art, may be made thereto without departing from the scope of the present invention.

It will be apparent to those skilled in the art that the preferred embodiment provides the advantages of a grounded grid configuration in that no neutralising is required and that also no screen power supply is required. In addition, the substantial advantages of very low drive R.F. energy requirement, no input tuning, and no premodulation requirement are also achieved. Furthermore, the arrangement is inherently stable and thus free from parasitic oscillations. Also because of the switched mode of operation, high levels of efficiency are obtained.

What I claim is:

1. An amplifier circuit comprising an electron tube having an anode, a cathode and a grid; the cathode being supplied with a first D.C. potential, the grid being supplied with a second D.C. potential and the anode being supplied with a third D.C. potential; said third potential being greater than said first potential, said first potential being greater than said second potential and said grid being A.C. coupled to ground; wherein said cathode is connected via switch means to a further potential less than said second potential, said switch means being operable at a rate determined by the desired frequency of the output of said anode.

2. An amplifier as claimed in claim 1 wherein said further potential is substantially ground potential.

3. An amplifier as claimed in claim 1 wherein said first potential is sufficiently higher than said second potential to substantially completely cut off any flow of current in said anode with said switch means open.

4. An amplifier as claimed in claim 1 wherein said electron tube is a triode.

5. An amplifier as claimed in claim 1 wherein said electron tube is a tetrode, the screen thereof being supplied with a fourth D.C. potential which is less than said third potential but greater than said first potential.

6. An amplifier as claimed in claim 1 wherein said electron tube is a pentode, the screen thereof being supplied with a fourth D.C. potential which is less than said third potential but greater than said first potential, and the suppressor grid thereof is grounded.

7. An amplifier as claimed in claim 1 wherein said anode is connected to an output tuned circuit which comprises the only tuned circuit of the amplifier.

8. An amplifier as claimed in claim 1 wherein said third potential is modulated to modulate said anode output.

9. An amplifier as claimed in claim 1 wherein said switch means comprises a transistor.

10. An amplifier as claimed in claim 9 wherein the emitter of said transistor is connected to said further potential, the collector of said emitter is connected to said cathode and the base of said transistor is connected to a pulse generator circuit which switches said transistor ON and OFF at a radio frequency rate.

* * * * *